United States Patent
Mokuno et al.

(10) Patent No.: US 7,736,435 B2
(45) Date of Patent: Jun. 15, 2010

(54) METHOD OF PRODUCING SINGLE CRYSTAL

(75) Inventors: Yoshiaki Mokuno, Ikeda (JP); Akiyoshi Chayahara, Ikeda (JP); Yuji Horino, Ikeda (JP); Naoji Fujimori, Ikeda (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 0 days.

(21) Appl. No.: 11/274,148

(22) Filed: Nov. 16, 2005

(65) Prior Publication Data

US 2006/0266279 A1 Nov. 30, 2006

(30) Foreign Application Priority Data

May 26, 2005 (JP) .............................. 2005-153233

(51) Int. Cl.
 *C30B 25/02* (2006.01)
(52) U.S. Cl. ............................ 117/101; 117/84; 117/88; 117/89; 117/105; 117/902; 257/E21.095; 257/E21.096; 257/E21.105; 257/E21.107; 423/446; 438/105
(58) Field of Classification Search ............... 117/75, 117/79, 92, 89, 84, 88, 101, 105, 902; 257/E21.095, 257/E21.096, E21.105, E21.107, E23.111; 423/446; 438/105
See application file for complete search history.

(56) References Cited

U.S. PATENT DOCUMENTS

| | | | | |
|---|---|---|---|---|
| 5,230,768 A | * | 7/1993 | Furukawa et al. | 117/101 |
| 5,474,021 A | * | 12/1995 | Tsuno et al. | 117/97 |
| 5,523,160 A | * | 6/1996 | Kobashi et al. | 428/408 |
| 6,096,129 A | * | 8/2000 | Saito et al. | 117/84 |
| 6,162,412 A | * | 12/2000 | Fujimori et al. | 423/446 |
| 6,483,125 B1 | * | 11/2002 | Brousseau, III | 257/69 |
| 6,653,653 B2 | * | 11/2003 | Brousseau, III | 257/39 |
| 6,858,078 B2 | | 2/2005 | Hemley et al. | |
| 7,060,130 B2 | * | 6/2006 | Golding et al. | 117/75 |

(Continued)

OTHER PUBLICATIONS

T. Ayalew: SiC Semiconductor Devices Technology, Modeling, and Simulation, 2.3.3.2 Homoepitaxial Growth, (See http://www.iue.tuwien.ac.at/phd/ayalew/node34.html viewed Oct. 28, 2007).*

(Continued)

*Primary Examiner*—Eric Hug
*Assistant Examiner*—Seyed Masoud Malekzadeh
(74) *Attorney, Agent, or Firm*—Westerman, Hattori, Daniels & Adrian, LLP

(57) ABSTRACT

A method for producing a single crystals by preferential epitaxial growth of {100} face, comprising the steps of (1) growing the crystal on a single crystal {100} substrate; (2) forming on the side of the grown crystal a surface parallel to a {100} face different from the {100}face in the growth direction, and (3) growing the crystal on the formed {100} surface; and the steps (2) and (3) being performed once or more than once. A method for producing a single-crystal diamond using a metallic holder for the single-crystal diamond having a crystal holding portion which is raised above an outer peripheral portion of the holder, is part from the outer peripheral portion of the holder, and has a recessed shape. The methods enable the production of a large single-crystal diamond in a comparatively short time at low cost.

24 Claims, 5 Drawing Sheets

U.S. PATENT DOCUMENTS

| | | | |
|---|---|---|---|
| 7,074,272 B2* | 7/2006 | Thompson et al. | 117/89 |
| 2003/0025133 A1* | 2/2003 | Brousseau, III | 257/213 |
| 2004/0069209 A1* | 4/2004 | Golding et al. | 117/2 |
| 2005/0105038 A1* | 5/2005 | Kondo et al. | 349/156 |
| 2005/0230713 A1* | 10/2005 | Brousseau, III | 257/213 |

OTHER PUBLICATIONS

A. Chayahara et al. "The effect of nitrogen addition during high-rate homoepitaxial growth of diamond by microwave plasma CVD", Diamond and Related Material, 13 (2004), p. 1954-1958.

Chih-shiue Yan et al. "Very high growth rate chemical vapor deposition of single-crystal diamond" PNAS, vlo.99, No. 20, Oct. 1, 2002, p. 12523-12525.

Y. Mokuno et al., "Synthesizing single-crystal diamond by repetition of high rate homoepitaxial growth by microwave plasma CVD", $10^{th}$ International Conference on New Diamond Science and Technology, May 11, 2005, p. 54.

Y. Mokuno et al. "Synthesizing single-crystal diamond by repetition of high rate homoepitaxial growth by microwave plasma CVD", $10^{th}$ International Conference on New Diamond Science and Technology, May 12, 2005.

Y. Mokuno et al. "High-rate growth of single crystalline diamond using microwave plasma CVD (II)", $18^{th}$ Diamond Symposium, Nov. 29, 2004, p. 48-49.

Bednarski, C., et al., "Studies of heteroepitaxial growth of diamond," Diamond and Related Materials, 12 (2003) pp. 241-245.

\* cited by examiner (a) (b) (c)

METHOD OF PRODUCING SINGLE CRYSTAL

BACKGROUND OF THE INVENTION (1) Field of the Invention

The present invention relates to a method of producing single crystal, and to single-crystal diamond obtained by the method.

(2) Description of the Related Art

Diamond possesses outstanding properties as semiconductor, and is hence expected to be used as a material for semiconductor devices such as high-frequency high-output devices, ultraviolet radiation luminescence devices, and the like. To bring such semiconductor devices into practical use, it is essential to supply large single-crystal substrates suited to device fabrication processes at low cost.

The growth of single-crystal diamond is mainly performed by high-pressure high-temperature synthetic methods, gaseous phase synthetic methods, and the like. Of these methods, high-pressure high-temperature synthetic methods wherein diamond is deposited and grown from a high-pressure high-temperature solvent have enabled the practical growth of carat (gemstone)-class large single crystals. However, these methods only produce single-crystal diamond substrates of about up to 10 mm diameter due to the limitations of the apparatus size, and it is therefore difficult to produce larger single-crystal diamonds.

In contrast, microwave plasma CVD is known as a promising gaseous phase synthetic method. In this method, the growth of single-crystal diamond takes place under a reduced-pressure atmosphere in a stream of hydrogen and methane gases, using plasma formed by microwave electric discharge. However, this method poses problems in that the growth face barely enlarges during the crystal growth process as occurs in other semiconductor materials, and that the growth rate is extremely low: only up to about 10 μm per hour. For these reasons, it requires very long processing times when attempting to produce large single-crystal diamonds, and is therefore unfeasible for producing large single-crystals.

As reported recently, in homoepitaxial growth of diamond by microwave plasma CVD, the growth of single-crystal diamond at a growth rate exceeding 100 μm per hour is possible by adding a small amount of nitrogen to a reaction gas of hydrogen and methane (Chayahara, Y. Mokuno, Y. Takasu, H. Yoshikawa, N. Fujimori; Diamond Relat. Mater. 13 (2004), 1954-1958).

However, preferentially {100} surfaces grow in this method, and it is difficult to enlarge crystal size by expanding the grown surface. Further, polycrystallization take places at the edges during the crystal growth process, thereby actually reducing the grown surface and failing to grow long crystal.

Furthermore, abnormal grain grows during the process of crystal growth from which hole-like (pipe-shaped) defects are formed and propagate in the growth direction. Once such defects are formed, the defects cannot be filled in by subsequent crystal growth.

For these reasons, it is difficult to grow a large single-crystal diamond by homoepitaxial growth using a microwave plasma CVD method.

By the way, when diamond crystals are grown at high growth rates by a microwave plasma CVD method, polycrystalline diamonds may deposit on the substrate holder. The polycrystalline diamonds tend to separate and be heated or shattered during the crystal growth. As a result, problems arise in that measuring the growth temperature using a radiation thermometer becomes difficult, polycrystalline diamond grains are taken into crystals by which defects are formed, etc. In view of this, the growth of film having a certain degree of thickness requires steps of growing a crystal to a predetermined thickness, discontinuing the growth, cleaning the substrate holder, followed by regrowing the crystal and repeating these steps to enlarge the crystal.

In this repetition of growth, although it is most desirable to polish the grown surface of the diamond evenly at every growth, such processing is difficult because a diamond is the hardest material. Therefore, attaining a polished surface having the surface smoothness suitable for regrowth is very time and cost consuming.

BRIEF SUMMARY OF THE INVENTION

The present invention has been accomplished in view of the disadvantages posed by the prior art, and the primary object of the invention is to provide a method for producing a single crystal by an epitaxial growth method, and in particular a novel CVD method for producing single-crystal diamond which is capable of producing a large single-crystal diamond in a comparatively short time at low cost.

The present inventors have conducted extensive research to accomplish the above, and consequently found the following. In the epitaxial growth method for producing a large single crystal, when three-dimensional expansion of a crystal is difficult because the crystal grows only in one direction due to the preferential growth of a {100} face, a large single crystal can be produced in a relatively easy manner by preferentially growing a crystal on a {100} surface of a seed crystal, then cutting and polishing the sides of the grown layers, and forming a defect-free surface parallel to a {100} face which is different from the {100} face of the growth direction, and further repeating the crystal growth on the formed surface. The present inventors further discovered that when a {100} surface of a single-crystal diamond is preferentially grown by the above method using a CVD method wherein a reaction gas contains hydrogen, carbon and nitrogen as constituent elements, a large single-crystal diamond, which has been difficult to produce by conventional method, can be produced in a comparatively easy manner at low cost. Furthermore, the inventors found that when a metallic holder for single-crystal diamond meeting specific conditions is used during the single-crystal diamond growth by a microwave plasma CVD method, a continuous growth of single-crystal diamond as well as a high-rate growth is attained because the surface morphology of the grown diamond becomes flat or convex, and then a thick single-crystal diamond is able to be continuously produced at a high rate without polishing grown surface. The inventors particularly found that an extremely large single-crystal diamond can be produced in a short time when a process of growing a single-crystal diamond {100} surface on a surface perpendicular to the {100} face of the growth direction is repeated using the specifically designed holder. The present invention has been accomplished based on the above findings.

The present invention provides methods for producing single crystal and single-crystal diamond obtained by the method as follows.

Item 1. A method for producing a single crystal by preferential epitaxial growth of {100} face, the method comprising the steps of:

(1) growing the crystal on a single crystal {100} substrate;

(2) forming on the side of the grown crystal a surface parallel to a {100} face different from the {100} face in the growth direction; and (3) growing the crystal on the formed {100} surface, the steps (2) and (3) being performed once or more than once (hereinafter sometimes referred to as "the first process of the invention").

Item 2. A method for producing a single-crystal diamond comprising the steps of:

(1) epitaxially growing the single-crystal diamond on a single-crystal diamond {100} substrate by a CVD method using a reaction gas containing hydrogen, carbon and nitrogen as constituent elements;

(2) forming on the side of the grown single-crystal diamond a surface parallel to another {100} face perpendicular to the {100} face in the growth direction; and (3) epitaxially growing the single-crystal diamond on the formed {100} surface by a CVD method using a reaction gas containing hydrogen, carbon and nitrogen as constituent elements, the steps (2) and (3) being performed once or more than once.

Item 3. A method for producing a single-crystal diamond according to Item 2, wherein the single-crystal diamond is grown by the step (1), followed by growing the single-crystal diamond on a {100} surface of the single-crystal diamond located at the rear surface of the grown surface, and the step (2) is then performed.

Item 4. A method for producing a single-crystal diamond, the method comprising the step of epitaxially growing a single-crystal diamond on a single-crystal diamond {100} substrate by a microwave plasma CVD method using reaction gas containing hydrogen, carbon and nitrogen as constituent elements, wherein used is a metallic holder for the single-crystal diamond having a holding portion for the single-crystal diamond which portion is raised above an outer peripheral portion of the holder, is apart from the outer peripheral portion of the holder and has a recessed shape; and the single-crystal diamond is placed on the holding portion for the single-crystal diamond of the holder so that the end portion of the single-crystal diamond is in contact with the inner side surface of the holding portion having the recessed shape or is spaced a small distance from the inner side surface, and the surface of the single crystal diamond is lower than the upper edge of the inner side surface of the recessed portion (hereinafter sometimes referred to as "the second process of the invention").

Item 5. A method for producing a single-crystal diamond, the method comprising the steps of:

epitaxially growing the single-crystal diamond on a single-crystal diamond {100} substrate by the method of Item 4, and growing the single-crystal diamond on the grown surface or on a {100} surface located at the rear surface of the grown surface by the method of claims 4, the growing step being performed once or more than once.

Item 6. A method for producing a single-crystal diamond comprising the steps of:

(1) epitaxitially growing a single-crystal diamond on a single-crystal diamond {100} substrate by the method according to Item 4 or 5;

(2) forming on the side of the grown single-crystal diamond a surface parallel to another {100} face perpendicular to the {100} face in the growth direction; and (3) growing the single-crystal diamond by a microwave plasma CVD method using a reaction gas containing hydrogen, carbon and nitrogen as constituent elements with the use of a metallic holder for the single-crystal diamond; the holder having a holding portion for the single-crystal diamond which portion is raised above an outer peripheral portion of the holder, is apart from the outer peripheral portion of the holder and has a recessed shape; and the single-crystal diamond which has the {100} surface formed by the step (2) being placed in the holding portion for the single-crystal diamond of the holder so that the end portion of the single-crystal diamond is in contact with the inner side surface of the holding portion having the recessed shape or is spaced a small distance from the inner side surface, and the surface of the single-crystal diamond is lower than the upper edge of the inner side surface of the recessed portion, the steps (2) and (3) being performed once or more than once (hereinafter sometimes referred to as "the third process of the invention").

Item 7. A method for producing a single-crystal diamond according to Item 6, wherein the step (3) for growing the single-crystal diamond further comprising the procedure of growing the single-crystal diamond on the grown surface of the single-crystal diamond once or more than once.

Item 8. A method for producing a single-crystal diamond according to any one of Items 4 to 7, wherein the holder for the single-crystal diamond has a structure such that a member comprising the holding portion for the single-crystal diamond is dissociated from a member comprising the outer peripheral portion.

Item 9. A single-crystal diamond comprising grown layers of single-crystal diamond grown in at least two perpendicular directions, and at least one perpendicular junction present at an interface between the single-crystal diamond starting material and a crystal grown layer, or at interfaces between crystal grown layers.

Item 10. A single-crystal diamond produced by a method according to any one of Items 2 to 8.

Figure 1:
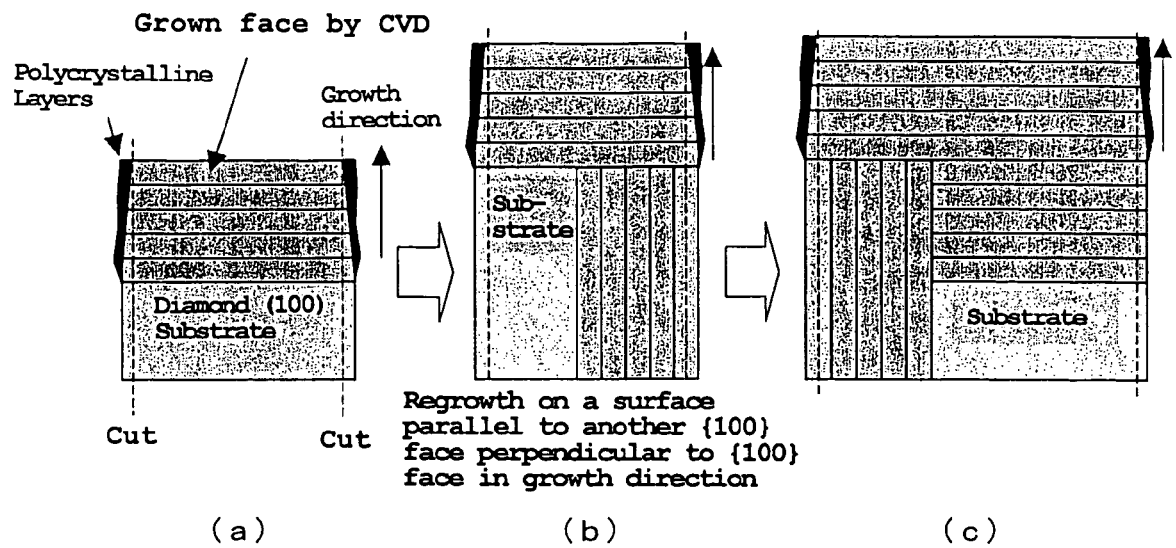
FIG. 1 is a schematic diagram showing processing steps according to a first process of the present invention.

In these drawings, 1 indicates a microwave plasma CVD system, 2 a microwave supply, 3 a waveguide to propagate microwaves, 4 a quartz window to introduce microwaves, 5 a cavity resonator-type reaction chamber, 5a a source gas feeder, 5b an exhaust port, 6 a cooling stage with cooling water W passing therethrough, 7 a holder for a single-crystal diamond, 7a a holding portion, 7b an outer peripheral portion, 7c a recessed portion, 7d a horizontal plane, 7e a slope, 7f an inner side surface of the recessed portion, 7g an upper edge of the inner side surface of the recessed portion, 7h a platform for a single-crystal diamond, 7i a member for a holding portion, 7j a member for an outer peripheral portion of the holder, 7k a member forming a bottom of a holding portion, 8 a single-crystal diamond, 8a and 8b edge portions of a single-crystal diamond, and 8c a center portion of a single-crystal diamond.

DETAILED DESCRIPTION OF THE INVENTION

Methods of producing single crystal of the present invention are described below in detail.

The First Process of the Present Invention

The first process of the invention relates to a method for enlarging the size of a single crystal in three dimensions by epitaxial growth.

The first process is a method for producing a single crystal by epitaxial growth, wherein {100} face of a single crystal is preferentially grown, comprising the steps of (1) growing a crystal on a single-crystal {100} substrate, (2) forming a surface on the side of the grown crystal which surface is parallel to {100} face different from {100} face in the growth direction, and (3) growing the crystal on the formed {100} surface, and the process comprising performing the above steps (2) and (3) once or more than once. According to the first process, when enlargement of the crystal by three-dimensional extension is difficult due to the preferential growth of (100) face in homoepitaxial growth using vapor phase growth, liquid phase growth or the like, a large single crystal can be easily produced by a comparatively simple manner.

Single crystals obtainable by the first process of the invention are not limited, and the process is applicable to the production of various single crystals such as of diamond, silicon, SiC, gallium arsenide, etc. The process is particularly effective when a crystal grows only in one direction and does not extend three-dimensionally due to the preferential {100} face growth of the crystal.

The first process of the invention is described hereinafter in detail with reference to a production process for single-crystal diamond.

High-pressure high-temperature synthetic methods and CVD methods are known as growth methods of single-crystal diamond; however the high-pressure high-temperature synthetic methods produce crystals in limited size due to restricted apparatus size. Given this, for the synthesis of large single crystals, it is preferable to use CVD methods by which the growable size of a crystal can be easily extended to the size of generally known semiconductor wafers.

In the method for producing a single-crystal diamond using the first process of the invention, applicable CVD methods are, for example, (1) microwave plasma CVD methods, (2) direct current or RF (radio-frequency) plasma CVD methods, (3) hot-filament CVD methods, and the like.

In the present invention, it is preferable to use a reaction gas containing hydrogen, carbon and nitrogen as constituent elements in these CVD methods. Conventional CVD methods usually use a reaction gas containing carbon as a constituent element to produce single-crystal diamond. In the first process, hydrogen atoms contained in a reaction gas can remove graphite components deposited on the crystal surface during growth and enable selective growth of diamond. Constituent nitrogen atoms further enable preferential {100} face growth.

The hydrogen, carbon and nitrogen atoms may all be contained in the same compound, or a mixture of two or more compounds containing one or more of the elements, i.e. hydrogen, carbon and nitrogen may be used. Reaction gases usually used are those containing a mixture of hydrogen-containing compounds, carbon-containing compounds and nitrogen-containing compounds. Usable examples of hydrogen-containing compounds are molecular hydrogen, etc. Usable examples of carbon-containing compounds are hydrocarbon compounds such as methane, acetylene, etc., and methanol, etc. Usable examples of nitrogen-containing compounds are molecular nitrogen, ammonia, and the like.

Each element, i.e. hydrogen, carbon and nitrogen, is preferably contained in the above reaction gas within an atomic ratio range of nitrogen:carbon being from about 0.001:1 to about 0.2:1, and an atomic ratio of carbon:hydrogen being from about 0.005:1 to about 0.1:1.

When the atomic ratio of nitrogen to carbon is smaller than 0.001:1, the probability of growing abnormal nuclei increases, thereby hindering continuous crystal growth for an extended period of time. On the other hand, when the atomic ratio of nitrogen to carbon is larger than 0.2:1, crystallinity is impaired eventually making epitaxial growth impossible. Therefore, neither case is preferable.

When the atomic ratio of carbon to hydrogen is smaller than 0.005:1, the crystal growth rate becomes less than 1 μm per hour, which is unsuitable for the growth of large single crystals. When the atomic ratio of carbon to hydrogen exceeds 0.1:1, carbon particles due to vapor phase polymerization mix in the formed film, thereby halting epitaxial growth. Therefore, neither case is preferable.

The above-mentioned reaction gas may further contain oxygen atom as a constituent element in the form of molecular oxygen or compounds. However, an atomic ratio of oxygen to carbon exceeding 0.5:1 inhibits the growth of diamond, and hence is not preferable.

Of the CVD methods mentioned above, a particularly preferable process for producing single-crystal diamond is a microwave plasma CVD method, using as a reactive gas a mixed gas of hydrogen, methane and nitrogen gases. In the microwave plasma CVD method, the mixing of impurity elements into the film can be largely prevented because plasma generated by discharge is separate from the inner wall of the vacuum chamber and the electrode. A reactive gas containing the above compounds is preferable because sources of high purity are easy to obtain.

When a microwave plasma CVD method is applied, the use of a mixed gas of hydrogen, methane and nitrogen as a reaction gas results in preferential {100} face growth of single-crystal diamond and a remarkable increase of growth rate compared with a case of single-crystal diamond growth using a mixed gas of hydrogen and methane. Furthermore, as a result of the preferential {100} face growth, occurrence of defects such as abnormal grain growth inhibiting normal crystal growth decreases, thereby growing a crystal having a surface morphology free from macroscopic roughness.

In a mixed gas of hydrogen, methane and nitrogen used as a reaction gas, methane is preferably supplied in an amount of about 0.01 to about 0.33 mol, and more preferably about 0.04 to about 0.12 mol, per mol of hydrogen supplies. Nitrogen is preferably supplied in an amount of about 0.0005 to about 0.1 mol, and more preferably about 0.0025 to about 0.05 mol, per mol of methane supplies.

The pressure inside the plasma CVD apparatus is usually about 13.3 to about 40 kPa. Microwaves typically used are those having a frequency of 2.45 GHz, 915 MHz, or like frequencies which are industrially or scientifically sanctioned. Microwave power for use is not limited, and is usually about 0.5 to about 5 kW. Within these ranges, conditions may be set so that the substrate (single-crystal diamond) temperature becomes about 1000 to about 1300° C.

In the method for producing a single-crystal diamond according to the first process of the invention, a single-crystal diamond is first grown on a diamond {100} substrate as a seed crystal, as shown in FIG. 1(a) by a CVD method such as a microwave plasma CVD method under the conditions described above. When a microwave plasma CVD method is used with a mixed gas of hydrogen, methane and nitrogen as a reaction gas to perform this operation, {100} surface of a diamond preferentially grows in particular. Further, when compared with a case in which nitrogen gas is not added, the crystal growth rate is significantly improved to a growth rate of about 20 µm/hr. to 150 µm/hr., and a high rate of crystal growth thereby becomes possible. Consequently, thick single crystals can be grown in a short time.

As a diamond seed crystal, a natural diamond may be used, and also synthetic single-crystal diamonds produced by, for example, high-pressure high-temperature synthetic methods and the like may be used. In the method of the invention, since {100} surface of a diamond preferentially grows, a seed crystal may be cut parallel to a {100} face and polished for use as a single-crystal diamond substrate.

During this growth step, in the case that polycrystalline diamond or amorphous carbon adheres to the holder for the single-crystal diamond, the holder may be cleaned to remove them or it may be replaced with another holder to continuously grow a single-crystal diamond.

Further, if necessary, after performing diamond crystal growth by the above process, a single-crystal diamond may be grown on a {100} surface located at the rear surface in the growth direction in the same manner as above. This operation enables a single-crystal diamond grown thicker in one direction to be obtained.

Subsequently, the crystal growth of diamond is temporarily halted, and as schematically shown in FIG. 1(b), the diamond crystal is further grown on a surface parallel to another {100} face perpendicular to the {100} face in the growth direction.

During the first growth step described above, the surface of the growth direction tends to be reduced toward the growth direction and polycrystalline diamond tends to deposit at the sides of the grown diamond. For these reasons, after single-crystal diamond is grown in the first step, the sides of the grown diamond are cut and polished, a surface is formed which is parallel to another {100} face perpendicular to the {100} face in the growth direction, and subsequently the diamond crystal can be grown on the formed surface. For this operation, a surface perpendicular to the growth direction and free of hole-like defects or other defects may be selected, cut and polished. For the crystal growth process in the second crystal growth step, CVD methods such as a microwave plasma CVD method as used in the above first crystal growth step may be used. Also in this step, diamond {100} face preferentially grows.

After the second crystal growth is performed in such manner, the diamond may further be grown on a {100} surface perpendicular to the {100} face in the growth direction as schematically shown in FIG. 1(c) to produce an even larger single-crystal diamond. For this operation, the sides of the grown surface are cut and polished in the same manner as after the first crystal growth step, a defect-free surface is then formed which is parallel to another {100} face perpendicular to the {100} face in the second growth direction, and diamond crystal may be grown on such a surface by CVD methods such as a microwave plasma CVD method under conditions as in the first crystal growth step. In this way, {100} surface of the diamond is preferentially grown.

According to the method for producing a single-crystal diamond using the first process of the invention, large single-crystal diamonds difficult to obtain by conventional methods can be easily produced by repeating the above growth step.

The Second Process of the Present Invention

The second process of the present invention relates to a method for producing a single-crystal diamond grown thick in one direction.

According to the second process, when a single-crystal diamond is grown under the condition described above by a microwave plasma CVD method using a reaction gas containing hydrogen, carbon and nitrogen as constituent elements, a metallic holder meeting the following conditions (i) to (iii) is used as a holder for the single-crystal diamond:

(i) a holding portion for the single-crystal diamond is raised above the outer peripheral portion of the holder, (ii) the holding portion is positioned apart from the outer peripheral portion of the holder, and (iii) the holding portion has a recessed shape.

The holder for a single-crystal diamond meeting the above conditions is described hereinafter referring to FIGS. 2 and 3.

Figure 2:
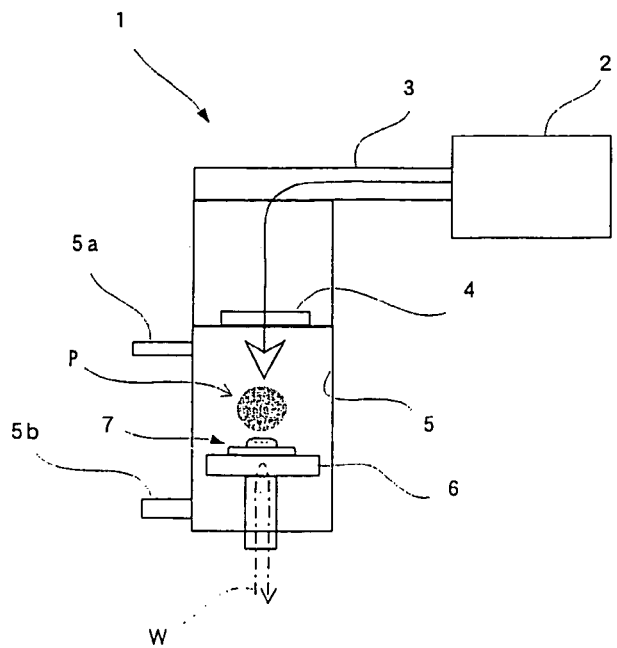
FIG. 2 is a schematic structural drawing showing the internal structure of a microwave plasma CVD system.

A microwave plasma CVD system as schematically shown in FIG. 2 is described. The microwave plasma CVD system 1 is equipped with a microwave supply 2, a waveguide 3 to propagate microwaves, a window 4 to introduce microwaves, a cavity resonator-type reaction chamber 5, a cooling stage 6 with cooling water W passing therethrough, and a holder 7 for a single-crystal diamond mounted on the stage 6.

The reaction chamber 5 has a source gas feeder 5a for introducing a source gas and an exhaust port 5b for evacuating the reaction chamber. The source gas is a mixed gas of methane, hydrogen and nitrogen.

Microwaves generated at the microwave supply 2 are introduced into the reaction chamber 5 as shown by an arrow in FIG. 2.

Next, the holder 7 for a single-crystal diamond is described. When the microwave plasma CVD system 1 has a metallic reaction chamber, the metallic holder 7 can be considered as being a part of the reaction chamber wall which encloses microwaves, and therefore configuration of the generated plasma in the reaction chamber is controlled by adjusting the configuration of the holder.

When condition (i) of those described above, i.e. the holding portion for the single-crystal diamond being raised above the outer peripheral portion of the holder, is met, the microwave electric field concentrates about the holding portion having a upheaval shape. As a result, a high diamond growth rate becomes feasible without increasing the microwave power to be supplied.

The height of the holder 7 for single-crystal diamond is preferably $\lambda/25$ to $\lambda/2$ when the free space wavelength of microwaves generated by the above microwave plasma CVD system is $\lambda$. A height smaller than $\lambda/25$ enters the plasma sheath region, failing to achieve the concentration effect of the plasma. Microwave plasma CVD systems are generally designed so that the reaction chamber has a space for plasma generation with a height (the measurement between the upper surface of the stage 6 and the ceiling of the reaction chamber 5) slightly greater than the free space wave length $\lambda$ of microwaves for causing standing waves in such a space, and that plasma is generated about halfway up the height of the space. For this reason, the holding portion is disposed at a position lower than such a height to distort the microwave electric field generated in the reaction chamber close to the holding portion, thereby concentrating the plasma at the holding portion. Accordingly, the height (H) of the holder is preferably $\lambda/2$ or smaller.

Condition (ii), i.e. the holding portion being positioned apart from the outer peripheral portion of the holder, ensures heat dissipates from the surface area extending from the holding portion to the outer peripheral portion, because the outer peripheral portion of the holder 7 and the raised holding portion are spaced apart from each other.

Figure 3:
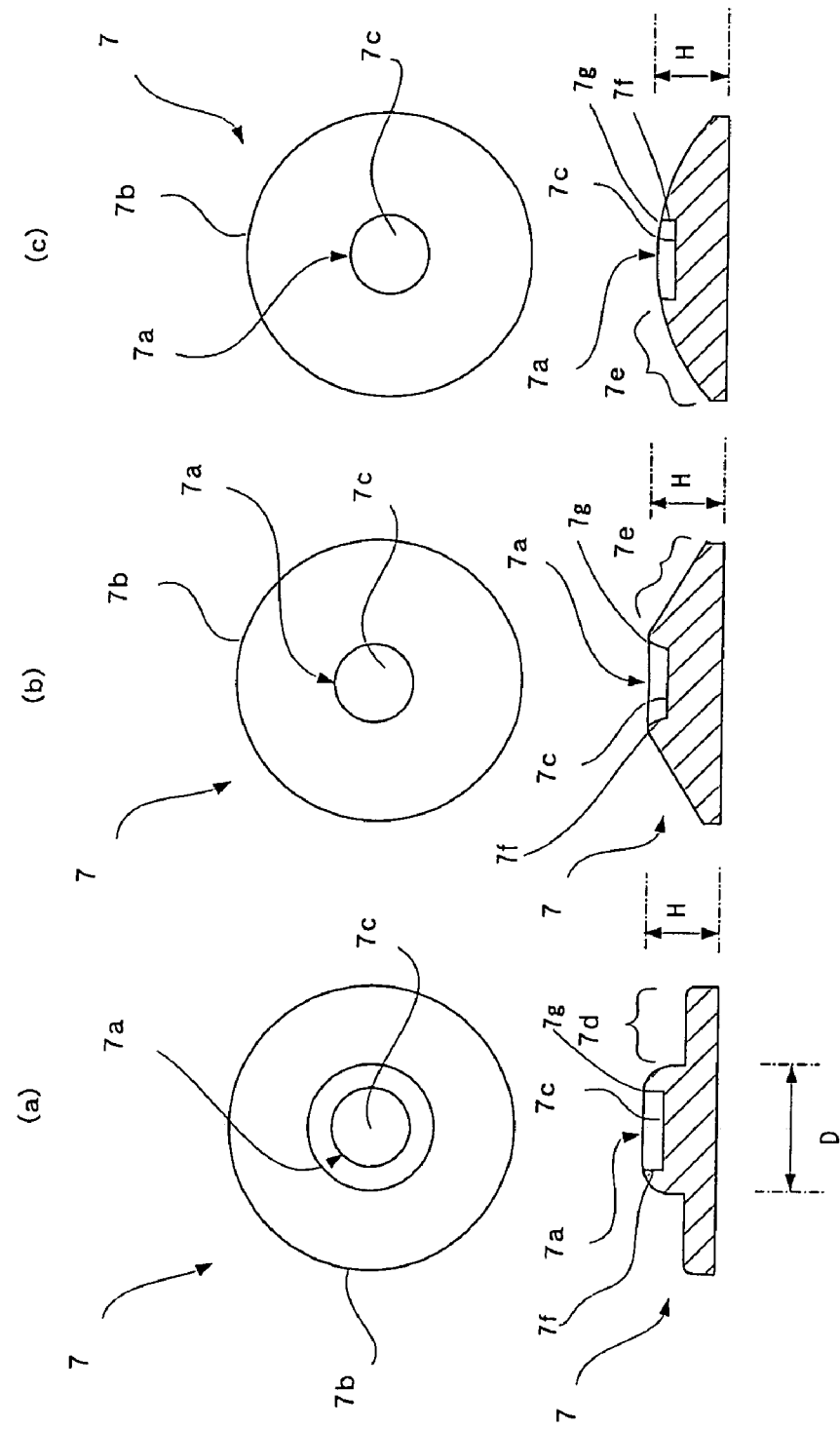
FIG. 3 shows three embodiments (a), (b) and (c) of a holder for a single-crystal diamond with plan views at the top and at the bottom, longitudinal cross-sectional views taken through their centers.

The holder 7 for single-crystal diamond is further described in detail referring to FIG. 3. All common components throughout the figures have the same characters and numbers.

In the embodiment shown in FIG. 3(a), the holding portion 7a is raised above the outer peripheral portion 7b of the holder 7 through a horizontal plane 7d. In this embodiment, the holder 7, as a whole, has a configuration of a boss on a flat plate.

In the embodiments shown in FIGS. 3(b) and (c), the holding portion 7a is raised above the outer peripheral portion 7b of the holder 7 through a smooth slope 7e. In these embodiments, the holder 7, as a whole, has a truncated conical configuration. The slope 7e may be flat (FIG. 3(b)), convex (FIG. 3(c)) or concave (not shown).

In the figures, the holder 7 is independently made from the stage 6, and placed thereon. Therefore, the holder 7 has a flat bottom, whose periphery connects with the outer peripheral portion 7b. The holder 7 may alternatively be integrated with the stage 6, instead of being a separate piece.

Condition (iii) for the holder 7 for single-crystal diamond is hereinafter described. In the second process of the invention, the holding portion 7a of the holder 7 has a recessed shape. In the second process, it is essential that the holding portion 7a has a recessed shape, and that a single-crystal diamond be placed so that end portion of the single-crystal diamond either contact with or is slightly spaced from the inner side surface 7f of the holding portion having a recessed shape, and further that the surface of the single-crystal diamond is positioned lower than the upper edge 7g of the inner side surface of the recessed portion. When these conditions are met, nucleation at the end portion of the single-crystal diamond is inhibited and the surface morphology of the grown single-crystal diamond becomes flat or convex, whereby a single-crystal diamond can be grown to a configuration suitable for continuous crystal growth.

The reasons behind this are not clear, but are presumably as follows: In the above process, the single-crystal diamond is placed so that the surface thereof does not protrude beyond the recessed portion and that the end portion of the crystal contacts with or is slightly spaced from inner side surface 7f of the recessed portion. As a result, plasma concentration at the end portion of the single-crystal diamond is prevented. Further, the temperature of the end portion of the single-crystal diamond becomes lower than that of the center portion thereof, because the heat dissipates from the end portion of the single-crystal diamond to the inner side surface of the holding portion having relatively low temperature and the reaction gas temperature around the end portion of the single-crystal diamonds is lower than that around the center thereof. Based on these phenomena, the crystal growth at the end portion of the crystal is inhibited and the crystal growth at the center is preferentially promoted.

Figure 4:
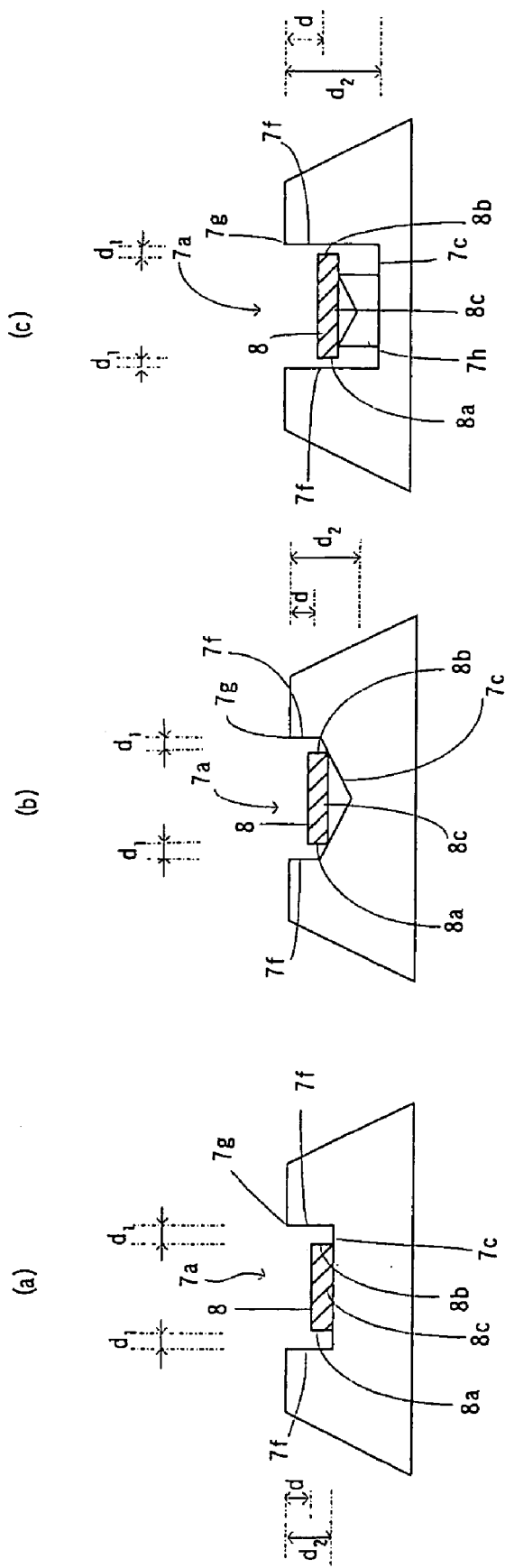
FIG. 4 shows longitudinal cross-sectional views through the centers of three embodiments, (a), (b) and (c), of holding portion of a holder for single-crystal diamond.

The specific configuration of the recessed portion of the holding portion 7a for a single-crystal diamond is not limited, and may be any configuration as long as the above conditions (i) to (iii) are met. FIG. 4 is longitudinal cross-sectional views through the center showing examples of configuration of the holding portion 7a.

In FIG. 4(a), the holding portion 7a is a cylindrical recessed portion 7c, and a single-crystal diamond 8 is placed at about the center of the recessed portion 7c. Both end portions 8a, 8b of the diamond are spaced a small distance $d_1$ from the inner side surface 7f of the recessed portion. The distance $d_1$ cannot be defined generally because it varies depending on the configurations of the recessed portion and single-crystal diamond, and the microwave plasma CVD conditions, etc. When the distance $d_1$ is too large, crystal growth at the end portion of the single-crystal diamond is not sufficiently inhibited and the grown face becomes a concave shape which becomes a deep indentation as crystal growth is repeated, so that crystal growth cannot be continued. This is presumably because when the distance $d_1$ is too large, heat dissipation to the inner side surface 7f of the holder, lowered reaction gas temperatures near the end portion of the single-crystal diamond, and like effects are not sufficiently attained, consequently failing to sufficiently lower temperatures at the end portions 8a, 8b of the single crystal diamond. Given this, the distance $d_1$ between each end portion 8a, 8b of a diamond 8 and the inner side surface 7f of the recessed portion must be determined so that the temperature at the end portions 8a, 8b of a single-crystal diamond is appropriately lowered and the end portions 8a, 8b of the crystal do not grow faster than the center of the crystal. More specifically, the distance $d_1$ may be set so that the grown surface of the single-crystal diamond becomes flat or convex, in accordance with the configuration and temperature of the recessed portion of the holder to be used, shape of the single-crystal diamond, microwave plasma CVD conditions, etc. Alternatively the end portions 8a, 8b of the single-crystal diamond may be in contact with the inner side surface 7f of the recessed portion. In this case, the end portions 8a, 8b receive increased cooling effects by the contact with the inner side surface 7f of the recessed portion, and crystal growth at the end portions can be sufficiently inhibited.

The depth $d_2$ of the recessed portion needs to be set so that the surface of the single-crystal diamond 8 is lower than the upper edge 7g of the inner side surface of the recessed portion 7c, and that the single-crystal diamond 8 does not protrude beyond the recessed portion 7c. The larger the depth $d_2$ of the recessed portion, the thicker the single-crystal diamond growable by microwave plasma CVD in one operation. However, when the depth $d_2$ of the recessed portion is too large, the growth rate of the single-crystal diamond decreases. The depth $d_2$ of the recessed portion may be set taking these points into consideration. The depth $d_2$ of the recessed portion is usually set within a range so that the distance d from the surface of the single-crystal diamond to the upper edge 7g of the inner side surface of the recessed portion is about 1 mm or less, depending on the desired thickness of crystal growth. For example, when a crystal growth of about 5 μm thickness is desired, the distance from the surface of the single-crystal diamond to the upper edge 7g of the inner side surface of the recessed portion may be about 5 μm.

In FIG. 4(b), the holding portion is the recessed portion 7c having cylindrical shape with its bottom being tapered (conical), and the single-crystal diamond 8 is in contact with the tapered bottom of the recessed portion only at its end portions 8a, 8b, and its center 8c is not in contact with the holder 7. In such a case, the crystal center 8c is suppressed to be cooled by the holder 7, and therefore the temperatures at the end portions 8a, 8b are easily made different from at the center 8c.

FIG. 4(c) shows another embodiment, wherein a platform 7h for the single-crystal diamond is provided at the bottom of the recessed portion 7c. With a holding portion 7a of such configuration, the center 8c of a single-crystal diamond is out of contact with the holder 7 and is thereby not cooled much, by which means temperatures at the end portions 8a, 8b are easily made different from that at the center.

Figure 5:
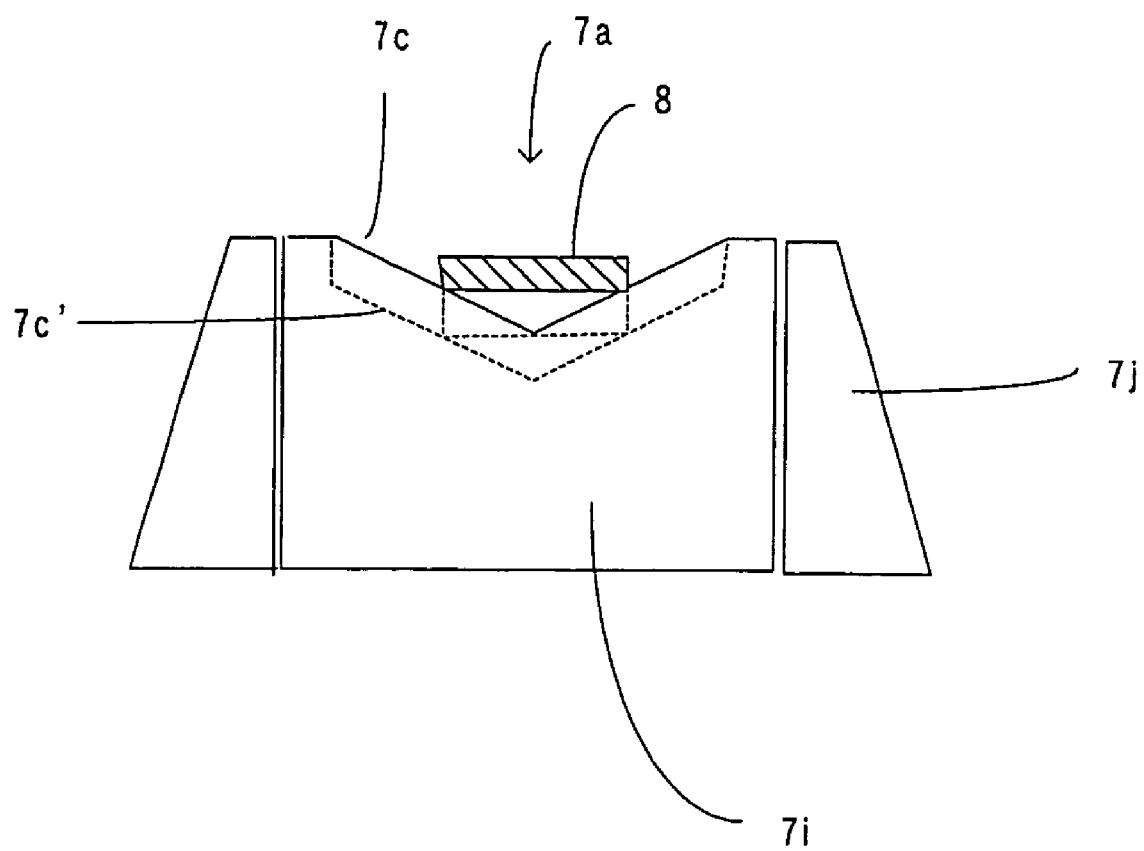
FIG. 5 is a longitudinal cross-sectional view through the center showing another embodiment of a holder for a single-crystal diamond.

FIG. 5 shows another embodiment of a holder for a single-crystal diamond. In the holder shown in FIG. 5, a member 7i comprising the holding portion 7a is independently formed from a member 7j comprising an outer peripheral portion of the holder. Using a holder having such a structure, when a large crystal grows, it is easy to independently reprocess the member 7i to give a deeper recessed portion 7c' as shown by the dotted line in the figure, or replace it with another member having a deeper recessed portion 7c', whereupon continuous crystal growth can proceed.

Figure 6:
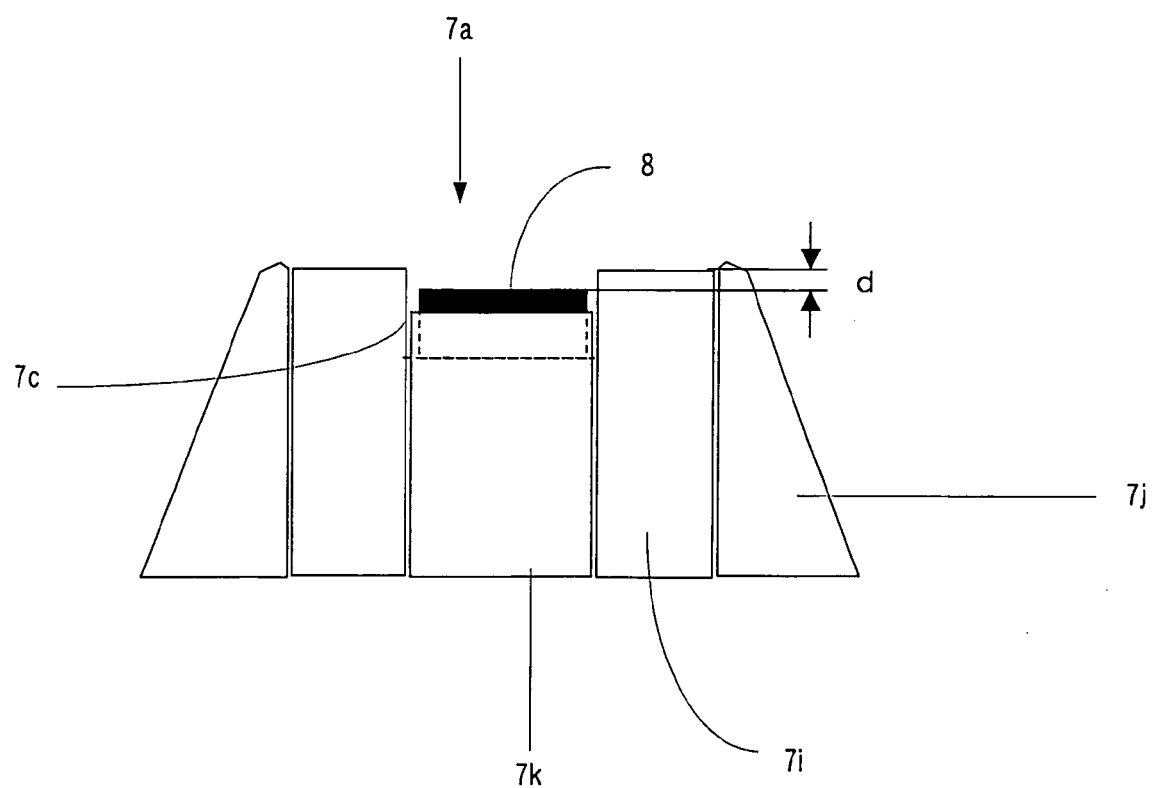
FIG. 6 is a longitudinal cross-sectional view through the center showing another embodiment of a holder for a single-crystal diamond.

Further, FIG. 6 shows another embodiment of a holder for a single-crystal diamond. In the holder shown in FIG. 6, a member 7i comprising a holding portion 7a is independently formed from a member 7j comprising an outer peripheral portion of the holder, and the bottom of the recessed portion is formed by an independent member 7k. Using a holder having such a structure, when crystal growth proceeds, the member 7k forming the bottom can independently be reprocessed or replaced with another member to continue crystal growth. Further, using such a holder, when a large crystal is grown, the member 7k forming the bottom can be slid down in the opposite direction to that of growth, maintaining the crystal growth position at a constant height, so that crystal growth can be continued steadily.

The second process of the invention requires the use of a metallic holder meeting conditions (i) to (iii) described earlier. Kinds of metal for forming the holder are not limited, and metals and alloys with high melting points and good thermal conductivities are preferably used. Examples are molybdenum, tungsten, and the like.

In the second process of the invention, a single-crystal diamond is grown by placing the single-crystal diamond on the holding portion 7a of the holder 7 for a single-crystal diamond meeting the above conditions so that the end portions 8a, 8b of the single-crystal diamond are in contact with or spaced a small distance from the inner side surface 7f of the holding portion having a recessed shape, and so that the crystal surface is positioned lower than the upper edge 7g of the inner side surface of the recessed portion during the growth of the single-crystal diamond.

The distance between each end portion of the single-crystal diamond and the inner side surface of the holding portion may be set, as described earlier, so that temperature at the end portion of the crystal becomes lower than that at the center, and the growth rate at the end portion of the crystal becomes about the same as or lower than the growth rate at the center of the crystal.

In this specification, the term "end portion" of a diamond crystal refers to the outer edge and the close vicinity thereof when using a tabular crystal. For example, in the case of a tabular crystal whose planar shape is a square, rectangle or other polygon, the "end portion" refers to its periphery consisting of each of its sides, and to the close vicinity of these sides. With a tabular crystal whose planar shape is circular, the "end portion" refers to its circumference and the close vicinity thereof.

For example, taking a case when the single-crystal diamond substrate is about 3 mm×3 mm square tabular and a holder with a configuration as shown in FIG. 4(b) or FIG. 5 is used, the distance between the inner side surface of the recessed portion and the end portion of the single-crystal diamond, i.e. the outer edge composed of each side of the tabular diamond, may be about 1 mm or less.

Of the methods for producing a single-crystal diamond described in the first process of the invention, a single-crystal diamond can be grown in the same manner as in a microwave plasma CVD method by using a reaction gas containing hydrogen, carbon and nitrogen as constituent elements.

Using this process, by the above effects as well as the effect of increasing plasma density immediately above the crystal by the use of a holder meeting conditions (i) to (iii) described earlier, a diamond can be grown at a high rate, and in particular, {100} faces grow preferentially. Further, a crystal holding portion having a recessed shape meeting the above conditions inhibits crystal growth at the end portion of the single-crystal diamond, thereby making the surface of the single-crystal diamond flat or convex.

In contrast, crystal growth at the end portion of a single-crystal diamond becomes great and the crystal surface becomes concave shape, if the holding portion has a flat shape instead of a recessed shape, or if the distance between the end portion of the single-crystal diamond and the inner side surface of the recessed portion is too large even with a recessed shape. If crystal growth is repeated under such conditions, a deep indentation is formed in the surface and crystal growth cannot be continued, failing to obtain a large single-crystal diamond.

The second process of the invention is not only capable of growing a single-crystal diamond thick in one direction at a high rate, but also capable of repeating crystal growth without polishing of the surface due to the flat or convex surface of the grown single-crystal diamond, thereby easily producing a thicker single-crystal diamond.

In the second process of the invention, diamond growth by a microwave plasma CVD method can be continued until the end portion of a grown single-crystal diamond reach the height of the upper edge 7g of the inner side surface of the recessed holding portion, or reach a slightly lower level than the height of the upper edge 7g, i.e. up to the level at which the end portion of a single-crystal diamond do not protrude beyond the recessed portion.

Further, for the production of an even thicker single-crystal diamond, further diamond growth may be continued one or more times by a microwave plasma CVD method using a holder meeting conditions (i) to (iii) described earlier depending on the shape of the grown crystal. A single-crystal diamond can be thereby continuously grown without polishing the surface because the grown face of the single-crystal diamond is flat or convex. By repeating such a process a number of times as necessary, a single-crystal diamond thick in one direction can be produced at low cost in a short time.

In the same manner as in the first process of the invention, single-crystal diamond may be grown on a {100} surface located at the rear surface in the growth direction in the same manner as above. This process also produces a single-crystal diamond grown thicker in one direction.

The Third Process of The Invention

The third process of the invention is a method for producing a single-crystal diamond, combining the method for producing a single-crystal diamond using the first process of the invention with the second process of the invention.

More specifically, a single-crystal diamond is grown using a holder meeting conditions (i) to (iii) described earlier. A thick single-crystal diamond grown in one direction is thereby produced.

Subsequently, in the same manner as in the first process of the invention, the sides of the grown crystal are cut and polished, a surface parallel to another {100} face perpendicular to the {100} face in the growth direction is formed, and single-crystal diamond is continuously grown on the formed surface in the same manner as in the second process of the invention. During such operation, crystal growth may be performed one or more times, replacing the holder when necessary.

By repeating such steps, a diamond seed crystal is surrounded by the grown crystal and a large-sized diamond single crystal is produced in a short time without polishing. This process enables the production of an unconventional extremely large single-crystal diamond in a short time, which should greatly promote various uses of single-crystal diamond.

Single Crystal Diamond

According to the method for producing a single-crystal diamond as described earlier in the second process of the invention, a large single-crystal diamond is easily produced in a short time using a microwave plasma CVD method. If multiple crystal grown steps are performed in one direction, observation of the obtained single-crystal diamond using an optical microscope shows interfaces between the single-crystal diamond starting material (diamond seed crystal) and grown crystal, and between grown layers as clear bands. Such interfaces are presumably formed by changes in quality such as defect densities, etc. of crystal grown during the beginning phase of crystal growth by CVD, which requires a certain time before growth conditions such as composition of the reaction gas, growth temperature, etc. reach the desired levels.

According to the fist and third processes of the present invention, a surface is formed which is parallel to another {100} face perpendicular to the {100} face in the growth direction, and subsequently a single-crystal diamond is grown on the formed {100} surface. As a result, a single-crystal diamond having grown layers of single-crystal diamond grown in at least two perpendicular directions is obtained, as shown in FIGS. 1(b) and (c). In addition to the bands appeared at the interfaces in the crystal produced by the second process, single-crystal diamonds obtained by these processes have at least one perpendicular junction present at an interface between the diamond seed crystal and a crystal grown layer, or interfaces between crystal grown layers, which interfaces are formed for the same reason as the above. In general, single-crystal diamonds grown by CVD methods characteristically form growth bands parallel to a surface perpendicular to the growth direction, because temperature and other growth conditions vary slightly during the growth process. The growth direction of layers can also be determined based on the direction of such growth bands. Diamond possessing such a structure is a formerly unrecognized novel single-crystal diamond.

According to the present invention, various large single crystals can be produced in a short time by a comparatively easy process. In particular, when applied to the production of single-crystal diamond, large single-crystal diamonds that are difficult to produce by conventional methods can be produced at low cost in a short time. These processes thus enable the production of large single-crystal diamonds, and thereby the production of various materials requiring single-crystal diamond, e.g. high power-high frequency electronic devices, high temperature semiconductor devices, environment-resistant electronic devices, etc. is made feasible.

EXAMPLES

The present invention is described in further details with reference to Examples below.

Example 1

A single-crystal diamond obtained by a high-pressure high-temperature synthetic method was cut parallel to a {100} face and polished to obtain a 3×3×0.5 mm$^3$ tabular crystal as a diamond seed crystal, which was then placed on a substrate (diamond seed crystal) holder in a microwave plasma CVD apparatus (FIG. 2) provided with a cavity resonator-type reaction chamber.

The reaction chamber was evacuated, H$_2$ gas was introduced, the pressure in the reaction chamber was set to 10 Torr (1333 Pa), and microwave power of 500 W at a frequency of 2.45 GHz were applied to generate plasma. Subsequently, the reactor pressure, H$_2$ gas flow rate and microwave power were gradually increased to ensure a pressure of 160 Torr (21.3 kPa) and a H$_2$ gas flow rate of 500 cc (standard conditions)/min. Then, the substrate temperature was set at 1130° C. while the microwave power was kept between 1000 and 3000 W, and N$_2$ gas and CH$_4$ gas were introduced at flow rate of 0.6 cc (standard conditions)/min. and 60 cc (standard conditions)/min. respectively to steadily grow diamond.

When adhesion of polycrystalline diamond to the substrate holder proceeds, the crystal growth was halted by stopping the flow of CH$_4$ and N$_2$ gases. The pressure, H$_2$ gas flow rate and microwave power were then gradually decreased until the microwave power reached 0, and the reaction chamber was opened to the air whereupon the grown crystal was taken out.

The polycrystalline diamond adhering to the substrate holder was then removed and the holder was reworked and then the single-crystal diamond was grown by the process described above. After repeating such operations 9 times, an oblong 3×3×3.3 mm$^3$ single-crystal diamond long in the direction vertical to the substrate surface was obtained.

This diamond was processed and mirror-polished, whereby a 2.4×2.6×3 mm$^3$ single-crystal diamond surrounded by {100} surfaces was obtained.

Subsequently, the growth of single-crystal diamond was repeated three times in the same manner as above on a surface ({100} face) perpendicular to the {100} face of the growth direction in the above process. As a result of measuring the thickness of the obtained single-crystal diamond using a micrometer, the thickness was found to have been increased about 1 mm in the growth direction.

In conclusion, using a 3×3×0.5 mm$^3$ single-crystal diamond as a seed crystal, a large 2.4×3.6×3 mm$^3$ single-crystal diamond was obtained. When observed using an optical microscope, growth bands are shown at interfaces between the substrate and CVD grown layers and those between each CVD grown layer appear as black striped pattern. The interfaces between the grown layers in the first growth direction was crossed at right angles with the interfaces between the grown layers in the second growth direction.

Example 2

In the microwave plasma CVD system (FIG. 2) used in Example 1, a diamond crystal was grown using as a substrate (single-crystal diamond) holder a molybdenum holder. The holder had a structure in which a member comprising a holding portion was dissociated from a member comprising an outer peripheral portion, as shown in FIG. 5. A single-crystal diamond obtained by a high-pressure high-temperature synthetic method was cut parallel to a {100} face and polished to obtain an octagonal tabular crystal of about 0.5 mm thickness for use as a seed crystal.

The growth steps were the same as in Example 1. The growth conditions were a pressure of 180 Torr (24 kPa), H$_2$ gas flow rate of 500 cc (standard conditions)/min., N$_2$ gas flow rate of 0.6 cc (standard conditions)/min., and CH$_4$ gas flow rate of 60 cc (standard conditions)/min. Further, microwave power was adjusted between 1540 and 2550 W to ensure a growth temperature of 1130° C.

For the first crystal growth, used was the member for a holding portion which had a cylindrical recessed shape with a diameter of 8.1 mm and a depth (d$_2$) of 1 mm. The single-crystal diamond was placed in this recessed portion so that the single-crystal diamond had a distance (d) of 0.5 mm from the surface of the diamond to the upper edge of the recessed holding portion, and the end portion of the single-crystal diamond was spaced a distance $d_1$ of 0.2 to 0.8 mm from the inner side surface of the recessed portion, and crystal growth was performed for 6 hours. As a result, the grown crystal had a thickness of about 0.26 mm, and the growth rate was 43 µm per hour.

The member comprising the holding portion of the substrate holder was then replaced with another member having a recessed portion with the shape as shown in Table 1, and crystal growth was continued on the grown surface by a microwave plasma CVD method under the same conditions as above.

Subsequently, the member comprising holding portion was replaced with those shown in Table 1 each in turn, and crystal growth was continued 17 times in total on the grown surface by microwave plasma CVD. For each crystal growth, the distance $d_1$ between the outer periphery of the single-crystal diamond and the inner side surface of the recessed portion was within the same range as in the first growth.

A single-crystal diamond of about 5 mm thickness and free of cracks on the grown surface thereby obtained.

TABLE 1

| Times of growth | Diameter of recessed portion (mm) | d (mm) | $d_2$ (mm) | Thickness of grown crystal (mm) |
| --- | --- | --- | --- | --- |
| 2 | 8.1 | 0.5 | 1.3 | 0.533 |
| 3 | 8.3 | 0.5 | 1.6 | 0.655 |
| 4 | 8.3 | 0.5 | 1.7 | 0.951 |
| 5 | 8.3 | 0.5 | 2.0 | 1.218 |
| 6 | 8.3 | 0.5 | 2.3 | 1.486 |
| 7 | 8.5 | 0.5 | 2.5 | 1.780 |
| 8 | 8.5 | 0.5 | 2.8 | 2.084 |
| 9 | 8.5 | 0.5 | 3.1 | 2.390 |
| 10 | 8.5 | 0.5 | 3.4 | 2.699 |
| 11 | 8.5 | 0.5 | 3.7 | 3.021 |
| 12 | 8.5 | 0.5 | 4.1 | 3.344 |
| 13 | 8.5 | 0.5 | 4.4 | 3.702 |
| 14 | 8.5 | 0.5 | 4.7 | 3.987 |
| 15 | 8.5 | 0.5 | 5.0 | 4.321 |
| 16 | 8.5 | 0.5 | 5.4 | 4.677 |
| 17 | 8.5 | 0.5 | 5.7 | 5.013 |

Example 3

Using the microwave plasma CVD system (FIG. 2) as used in Example 1, a diamond crystal was grown using a molybdenum substrate holder having a structure as shown in FIG. 6. The same single-crystal diamond as used in Example 1 was used as a seed crystal.

Crystal growth was performed in the same manner as in Example 1, with the growth conditions under a pressure of 180 Torr (24 kPa), $H_2$ gas flow rate of 500 cc (standard conditions)/min., $N_2$ gas flow rate of 0.6 cc (standard conditions)/min., and $CH_4$ gas flow rate of 60 cc (standard conditions)/min. Further, the microwave power was adjusted between 2390 and 2830 W to ensure a growth temperature of 1160° C.

For the first crystal growth, the holder used had a holding portion having a cylindrical recessed shape with a diameter of 5 mm and a depth $d_2$ of 1 mm. The single-crystal diamond was placed in the center of this recessed portion so that the surface of the single-crystal diamond had a distance (d) of 0.5 mm to the upper edge of the recessed holding portion, and crystal growth was performed for 3 hours.

The grown crystal had a thickness of about 0.18 mm, and the growth rate was 60 µm per hour. Observation using a differential interference microscope and the results of the surface morphology measurement by a laser microscope showed that the crystal had an upwardly convex surface and crystal growth at the end portion was inhibited.

The invention claimed is:

1. A method for producing a single crystal by preferential epitaxial growth of {100} face, the method comprising the steps of:
   (1) growing in a growth direction a single crystal homoepitaxially on a first {100} face of a single crystal {100} substrate, the single crystal grown being the same material as the single crystal of the substrate;
   (2) cutting and polishing a side of the grown single crystal to form a surface parallel to a second {100} face of the single crystal {100} substrate; and
   (3) growing the crystal homoepitaxially on the surface parallel to the second {100} face of the single crystal {100} substrate, the single crystal grown being the same material as the single crystal {100} substrate,
   the steps (2) and (3) being performed once or more than once to form a single crystal grown on at least two surfaces in different directions.

2. A method for producing a single-crystal diamond comprising the steps of:
   (1) epitaxially growing in a growth direction the single-crystal diamond on a first {100} face of a single-crystal diamond {100} substrate by a CVD method in the presence of a reaction gas containing hydrogen, carbon and nitrogen as constituent elements;
   (2) cutting and polishing a side of the grown single-crystal diamond to form a surface parallel to a second {100} face of the single crystal diamond {100} substrate and perpendicular to the first {100} face of the single crystal diamond {100} substrate; and
   (3) epitaxially growing the single-crystal diamond on the surface parallel to the second {100} face of the single crystal diamond {100} substrate and perpendicular to the first {100} face of the single-crystal diamond {100} substrate by a CVD method in the presence of a reaction gas containing hydrogen, carbon and nitrogen as constituent elements,
   the steps (2) and (3) being performed once or more than once.

3. The method for producing a single-crystal diamond according to claim 2, wherein the single-crystal diamond is epitaxially grown by the step (1), followed by growing the single-crystal diamond on the second {100} face of the single-crystal diamond {100} substrate opposite from the first {100} face of the single-crystal diamond {100} substrate, and the step (2) is then performed.

4. A method for producing a single-crystal diamond, the method comprising
   (1) a step of epitaxially growing the single-crystal diamond on a first {100} face of a single-crystal diamond {100} substrate by a microwave plasma CVD method in the presence of a reaction gas containing hydrogen, carbon and nitrogen as constituent elements to form a grown single-crystal diamond,
   wherein the single-crystal diamond {100} substrate is held by a metallic holder having a holding portion for holding the single-crystal diamond {100} substrate, wherein the holding portion is raised above an outer peripheral portion of the metallic holder, is apart from the outer peripheral portion of the metallic holder and has a recessed shape; and the single-crystal diamond {100} substrate is placed on the holding portion so that an end portion of the single-crystal diamond {100} substrate is in contact with an inner side surface of the holding portion having the recessed shape or is spaced a small distance from the inner side surface of the holding portion having the recessed shape, and an upper surface of the single crystal diamond is lower than an upper edge of the inner side surface of the holding portion having the recessed shape.

5. The method for producing a single-crystal diamond of claim 4, comprising, after step (1), steps (2') or (3')
   (2') epitaxially growing the single-crystal diamond on the single-crystal diamond of step (1) by a microwave plasma CVD method in the presence of a reaction gas containing hydrogen, carbon and nitrogen as constituent elements, the epitaxially growing step being performed once or more than once,
   (3') epitaxially growing the single-crystal diamond on a second {100} face of the single-crystal diamond {100} substrate opposite from the first {100} face of the single-crystal diamond {100} substrate by a microwave plasma CVD method in the presence of a reaction gas containing hydrogen, carbon and nitrogen as constituent elements, the epitaxially growing step being performed once or more than once.

6. The method for producing a single-crystal diamond according to claim 4, further comprising the steps of:
   (2) cutting and polishing a side of the grown single-crystal diamond of step (1) to form a surface parallel to a second {100} face of the single crystal {100} substrate and perpendicular to the first {100} face of the single crystal {100} substrate; and
   (3) growing the single-crystal diamond on the surface parallel to the second {100} face by a microwave plasma CVD method in the presence of a reaction gas containing hydrogen, carbon and nitrogen as constituent elements with the use of a metallic holder for the single-crystal diamond,
   the metallic holder of step (3) having a holding portion for holding the single-crystal diamond formed in step (2), wherein the holding portion is raised above an outer peripheral portion of the metallic holder, is apart from the outer peripheral portion of the metallic holder and has a recessed shape; and
   the single-crystal diamond formed in step (2) being placed in the holding portion so that an end portion of the single-crystal diamond formed in step (2) is in contact with an inner side surface of the holding portion having the recessed shape or is spaced a small distance from the inner side surface, and an upper surface of the single-crystal diamond is lower than the upper edge of the inner side surface of the holding portion having the recessed shape,
   the steps (2) and (3) being performed once or more than once.

7. A method for producing a single-crystal diamond comprising the steps of:
   (1) epitaxially growing a single-crystal diamond by the method according to claim 5,
   (2) cutting and polishing a side of the grown single-crystal diamond of step (1) to form a surface parallel to a second {100} face of the single crystal diamond {100} substrate and perpendicular to the first {100} face of the single crystal diamond {100} substrate; and
   (3) growing the single-crystal diamond on the surface parallel to the second {100} face of the single crystal {100} substrate and perpendicular to the first {100} face of the single crystal diamond {100} substrate by a microwave plasma CVD method in the presence of a reaction gas containing hydrogen, carbon and nitrogen as constituent elements with the use of a metallic holder for the single-crystal diamond,
   the metallic holder of step (3) having a holding portion for holding the single-crystal diamond formed in step (2), wherein the holding portion is raised above an outer peripheral portion of the metallic holder, is apart from the outer peripheral portion of the metallic holder and has a recessed shape; and
   the single-crystal diamond formed in step (2) being placed in the holding portion so that an end portion of the single-crystal diamond formed in step (2) is in contact with an inner side surface of the holding portion having the recessed shape or is spaced a small distance from the inner side surface, and an upper surface of the single-crystal diamond is lower than the upper edge of the inner side surface of the holding portion having the recessed shape,
   the steps (2) and (3) being performed once or more than once.

8. The method for producing a single-crystal diamond according to claim 6, wherein the step (3) for growing the single-crystal diamond further comprises the procedure of growing the single-crystal diamond on the grown surface of the single-crystal diamond once or more than once.

9. The method for producing a single-crystal diamond according to claim 7, wherein the step (3) for growing the single-crystal diamond further comprises the procedure of growing the single-crystal diamond on the grown surface of the single-crystal diamond once or more than once.

10. The method for producing a single-crystal diamond according to claim 4, wherein the holder for the single-crystal diamond has a structure such that a member comprising the holding portion for the single-crystal diamond is dissociated from a member comprising the outer peripheral portion.

11. A single-crystal diamond comprising
   a single-crystal diamond starting material,
   layers of single-crystal diamond grown in at least two perpendicular directions on the single-crystal diamond starting material and
   at least one perpendicular junction present at an interface between the single-crystal diamond starting material and a diamond crystal grown layer, or at interfaces between diamond crystal grown layers,
   the perpendicular junction being formed with an interface between a single-crystal diamond starting material and a diamond crystal grown layer, or with an interface between diamond crystal grown layers, and
   at least one perpendicular junction having a T-shape.

12. A single-crystal diamond produced by the method according to claim 2, said single-crystal diamond including said single crystal {100} substrate.

13. A single-crystal diamond produced by the method according to claim 3, said single-crystal diamond including said single crystal {100} substrate.

14. A single-crystal diamond produced by the method according to claim 6, said single-crystal diamond including said single crystal {100} substrate.

15. A single-crystal diamond produced by the method according to claim 7, said single-crystal diamond including said single crystal {100} substrate.

16. A single-crystal diamond produced by the method according to claim 8, said single-crystal diamond including said single crystal {100} substrate.

17. A single-crystal diamond produced by the method according to claim 9, said single-crystal diamond including said single crystal {100} substrate.

18. The method for producing a single crystal of claim 1, wherein the steps (2) and (3) are performed more than once to form a single crystal grown on at least two surfaces in different directions.

19. The method for producing a single-crystal diamond of claim 2, wherein the steps (2) and (3) are preformed more than once.

20. The method for producing a single-crystal diamond of claim 6, wherein the steps (2) and (3) are preformed more than once.

21. The method for producing a single crystal according to claim 1, further comprising the step of placing the surface formed in step (2) parallel to the second {100} face in the same direction as the growth direction of step (1), before step (3).

22. The method for producing a single-crystal diamond according to claim 2, further comprising the step of placing the surface formed in step (2) parallel to the second {100} face in the same direction as the growth direction of step (1), before step (3).

23. The method for producing a single-crystal diamond according to claim 6, wherein the height of the metallic holder is $\lambda/25$ to $\lambda/2$ when the free space wavelength of microwaves generated by a microwave plasma CVD system to be used is $\lambda$.

24. The method for producing a single-crystal diamond according to claim 7, wherein the height of the metallic holder is $\lambda/25$ to $\lambda/2$ when the free space wavelength of microwaves generated by a microwave plasma CVD system to be used is $\lambda$.

* * * * *